(12) United States Patent
Jeon et al.

(10) Patent No.: US 10,811,287 B2
(45) Date of Patent: Oct. 20, 2020

(54) SPIN COATER AND SUBSTRATE TREATING APPARATUS HAVING THE SAME

(71) Applicant: SAMSUNG ELECTRONICS CO., LTD., Suwon-si, Gyeonggi-Do (KR)

(72) Inventors: Hyun-Joo Jeon, Hwaseong-si (KR); Sung-Hyup Kim, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/128,990

(22) Filed: Sep. 12, 2018

(65) Prior Publication Data
US 2019/0157116 A1    May 23, 2019

(30) Foreign Application Priority Data
Nov. 17, 2017    (KR) .................... 10-2017-0154316

(51) Int. Cl.
| | |
|---|---|
| H01L 21/67 | (2006.01) |
| B05C 11/08 | (2006.01) |
| H01L 21/687 | (2006.01) |
| B05C 13/02 | (2006.01) |

(52) U.S. Cl.
CPC .......... H01L 21/6715 (2013.01); B05C 11/08 (2013.01); B05C 13/02 (2013.01); H01L 21/68735 (2013.01)

(58) Field of Classification Search
CPC ......... B05C 11/08; B05C 13/02; B05C 13/00; H01L 21/00; H01L 21/68735; H01L 21/67126; H01L 21/68721; H01L 21/6715; C23C 14/50; Y10S 156/915; Y10S 269/903; B24B 37/32

USPC ............................................................ 118/52
See application file for complete search history.

(56) References Cited

U.S. PATENT DOCUMENTS

| | | | |
|---|---|---|---|
| 6,040,011 A * | 3/2000 | Yudovsky | ........... C23C 16/4412 118/728 |
| 6,053,977 A | 4/2000 | Konishi | |
| 6,223,447 B1 * | 5/2001 | Yudovsky | ......... H01L 21/68721 118/725 |
| 6,527,860 B1 | 3/2003 | Yoshihara et al. | |
| 7,582,163 B2 | 9/2009 | Kim et al. | |
| 2009/0000645 A1 * | 1/2009 | Passegger | ......... H01L 21/67028 134/21 |

FOREIGN PATENT DOCUMENTS

| | | | | |
|---|---|---|---|---|
| DE | 19807460 | * | 4/1999 | ........... H01L 21/670 |
| JP | 1999-070354 | | 3/1999 | |

(Continued)

OTHER PUBLICATIONS

English Translation of DE19807460 (LANGEN) published Apr. 1999 (six pages). (Year: 1999).*

*Primary Examiner* — Laura Edwards
(74) *Attorney, Agent, or Firm* — F. Chau & Associates, LLC

(57) ABSTRACT

A spin coater includes a rotatable chuck structure configured to hold a substrate, a bowl enclosing the substrate and guiding a flow of a fluid around the substrate to a bottom of the bowl, and a flow controller detachably coupled to the bowl such that the flow controller is arranged between the bowl and an edge of the substrate and separates the flow into a linear flow and a non-linear flow.

16 Claims, 7 Drawing Sheets

(56) References Cited

FOREIGN PATENT DOCUMENTS

| | | |
|---|---|---|
| JP | 4318913 | 6/2009 |
| JP | 2012-019025 | 1/2012 |
| KR | 10-0191824 | 1/1999 |
| KR | 10-0284102 | 12/2000 |
| KR | 1020020091664 | 12/2002 |
| KR | 1020040017162 | 2/2004 |
| KR | 1020050109099 | 11/2005 |
| KR | 10-0574303 | 4/2006 |
| KR | 20-0403657 | 12/2006 |
| KR | 10-1654621 | 8/2016 |

* cited by examiner

SPIN COATER AND SUBSTRATE TREATING APPARATUS HAVING THE SAME

CROSS-REFERENCE TO RELATED APPLICATIONS

This U.S. application claims priority under 35 U.S.C § 119 to Korean Patent Application No. 10-2017-0154316 filed on Nov. 17, 2017 in the Korean Intellectual Property Office, the contents of which are incorporated by reference herein in its entirety.

BACKGROUND

1. Technical Field

Exemplary embodiments of the inventive concept relate to a spin coater and a substrate treating apparatus and system having the same, and more particularly, to a photoresist spin coater for forming a photoresist layer on a rotating substrate and a substrate treating apparatus and system having the same.

2. Discussion of Related Art

A photolithography process has been widely used for forming various patterns on a substrate for semiconductor devices and on a glass substrate for flat panel devices.

A general photolithography process may include a coating process for coating photo sensitive materials on the substrate to form a photosensitive layer on the substrate, an exposure process exposing the photosensitive layer to light using a reticle and a developing process for developing the exposed photosensitive layer into a circuit pattern.

The coating process is generally conducted by a spin coating technique in which the photosensitive materials are supplied onto a rotating substrate to a sufficient thickness. In such a case, the thickness of the photosensitive layer can be controlled by changing the rotation speed of the substrate.

In such a case, since the photosensitive materials are generally viscous and the substrate is rotated at a sufficient speed, the particles of the photosensitive materials, which are supplied to a central portion of the substrate, generally spread out on a surface of the substrate and flow from the central portion to the edge portion. The photosensitive materials exiting from the edge portion of the substrate are discharged from a coating apparatus. For those reasons, when exiting from the substrate at an edge portion in the coating apparatus, the particles of the photosensitive materials generally splash and collide onto the bowl of the coating apparatus enclosing the substrate and then return onto the substrate. In addition, the photosensitive materials usually flow in whirls around the edge portion of the substrate and flow backwards to the substrate, thereby contaminating the photosensitive layer on the substrate.

Further, the flow speed of the air passing through the coating apparatus together with the photosensitive materials decreases as the photosensitive materials flow from the central portion and the edge portion of the substrate, and thus the photosensitive layer is formed to be much thicker at the edge portion, due to the speed difference between the central portion and the edge portion.

SUMMARY

At least one exemplary embodiment of the present inventive concept provides a spin coater having a flow controller detachably interposed between the surface of the bowl and the edge portion of the substrate.

At least one exemplary embodiment of the present inventive concept provides a substrate treating apparatus having the above spin coater.

At least one exemplary embodiment of the present inventive concept provides a substrate treating system having the above substrate treating apparatus.

According to exemplary embodiment of the inventive concept, there is provided a spin coater including a rotatable chuck structure configured to hold a substrate, a bowl enclosing the substrate and configured to a guide a flow of fluid around the substrate to a bottom of the bowl and a flow controller detachably coupled to the bowl. The flow controller is arranged between the bowl and an edge of the substrate to separate the flow into a linear flow and a non-linear flow.

According to an exemplary embodiment of the inventive concept, there is provided a substrate treating apparatus including a housing having a gate configured to receive a substrate, a flow generator arranged at a ceiling of the housing and generating an air flow descending from the ceiling to a bottom of the housing, a chemical supplier supplying configured to supply chemicals onto the substrate, and a spin coater secured to the bottom of the housing for coating the chemicals on the substrate. The spin coater includes a rotatable chuck structure configured to hold the substrate, a bowl enclosing the substrate and configured to guide a chemical flow of the chemicals and the air flow around the substrate to a bottom of the bowl, and a flow controller detachably coupled to the bowl such that the flow controller is arranged between the bowl and an edge of the substrate to separate the chemical flow and the air flow into a linear flow and a non-linear flow.

According to exemplary embodiments of the inventive concept, there is provided a substrate treating system including a carrier unit configured to receive a substrate carrier in which a plurality of substrates are held, a substrate treating apparatus having a spin coater for forming a coating layer on one of the substrates that is secured to a rotatable chuck, and a transfer unit configured to transfer the one substrate between the carrier unit and the substrate treating apparatus. The spin coater includes a bowl enclosing the chuck and a flow controller arranged between the bowl and the substrate to separate a chemical flow of coating chemicals and an air flow into a linear flow having a relatively higher flow speed and a non-linear flow having a relatively lower flow speed.

According to exemplary embodiments of the inventive concept, there is provided a spin coater including a rotatable chuck structure configured to hold a substrate; a bowl enclosing the rotatable chuck structure; a first ring detachably coupled to an upper portion of the bowl; a second ring enclosing the rotatable chuck structure; and a connector connecting the second ring to the first ring.

According to exemplary embodiment of the present inventive concept, a flow controller is arranged in a flow space between the sidewall of the bowl and the edge of the substrate in such a configuration that the chemical flow is separated into a linear flow having a relatively higher speed and a non-linear flow having a relatively lower flow speed. Thus, flow loss of the chemical flow may be sufficiently prevented at the edge of the substrate to thereby sufficiently preventing the sedimentation of the chemicals and the edge beads at the edge of the substrate. In addition, the vertex of the chemical flow may be sufficiently prevented around the bottom of the bowl by the flow controller 300, so that the minute particles of the photoresist flow may be prevented from returning onto the coating layer on the substrate W, thereby minimizing the particle contamination to the coating layer due to the vertex reduction.

Particularly, the flow controller may be detachably coupled to the bowl just by the manual combination of the body to the upper portion of the bowl without any additional combination tools, thereby facilitating the combination of the bowl and the flow controller. The flow controller and the bowl may be simultaneously manufactured in a single injection molding process, thereby facilitating the manufacture of the flow controller as well as the combination of the flow controller to the bowl.

BRIEF DESCRIPTION OF THE DRAWINGS

The inventive concept will become more apparent by describing in detail exemplary embodiments thereof with reference to the accompanying drawings of which.

DETAILED DESCRIPTION OF THE EXEMPLARY EMBODIMENTS

Figure 1:
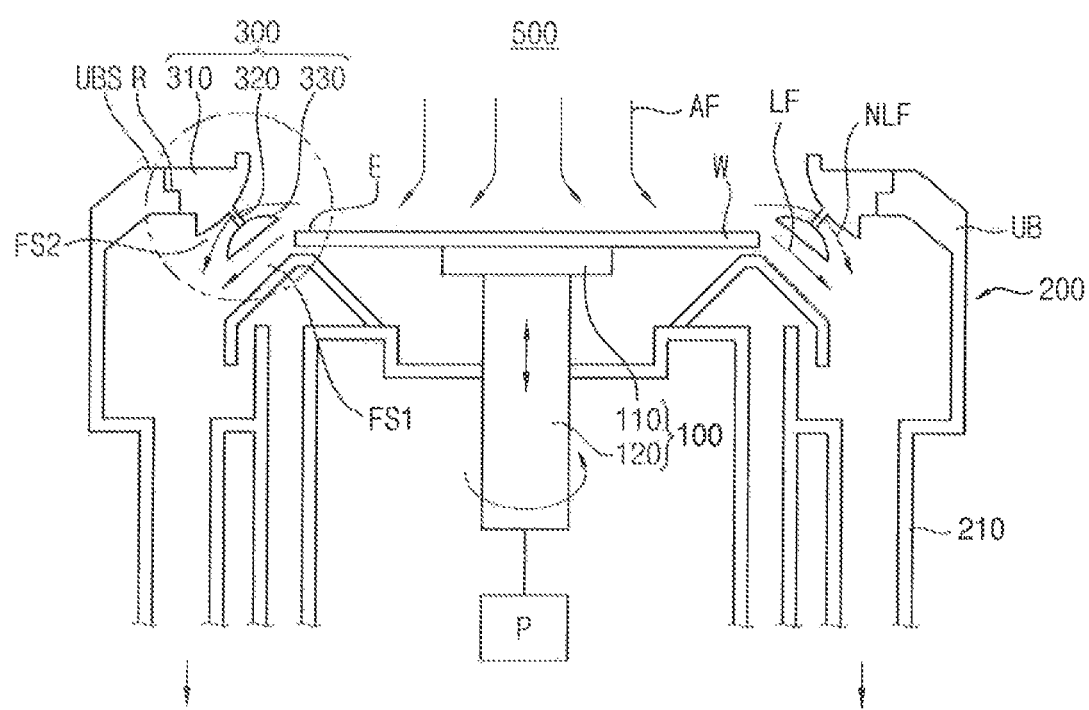
FIG. 1 is a structural view illustrating a spin coater in accordance with an exemplary embodiment of the present inventive concept.

Reference will now be made to exemplary embodiments of the inventive concept, which are illustrated in the accompanying drawings, wherein like reference numerals refer to like components throughout.

Figure 2:
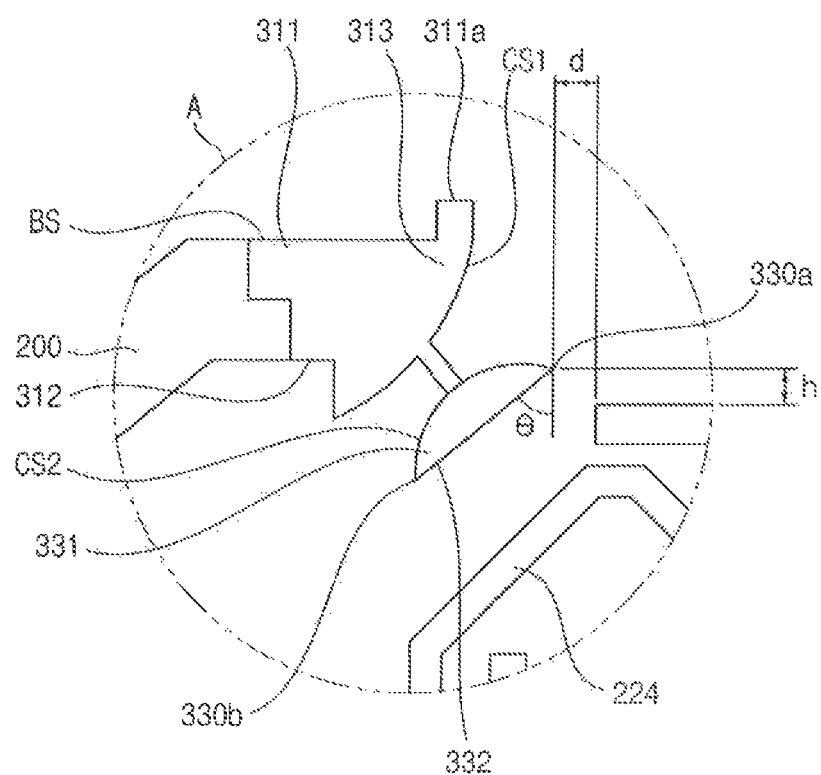
FIG. 2 is an enlarged view of a portion A of the spin coater shown in FIG. 1.
Figure 3:
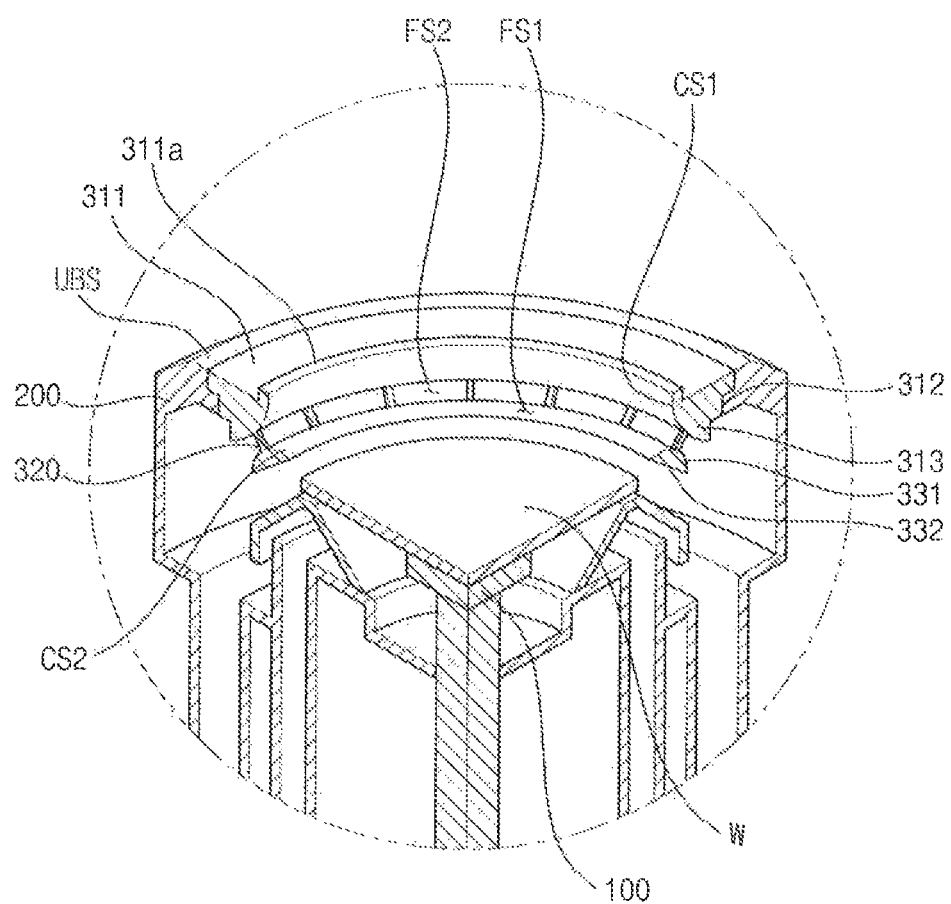
FIG. 3 is a perspective view illustrating the portion A of the spin coater shown in FIG. 2.
Figure 4:
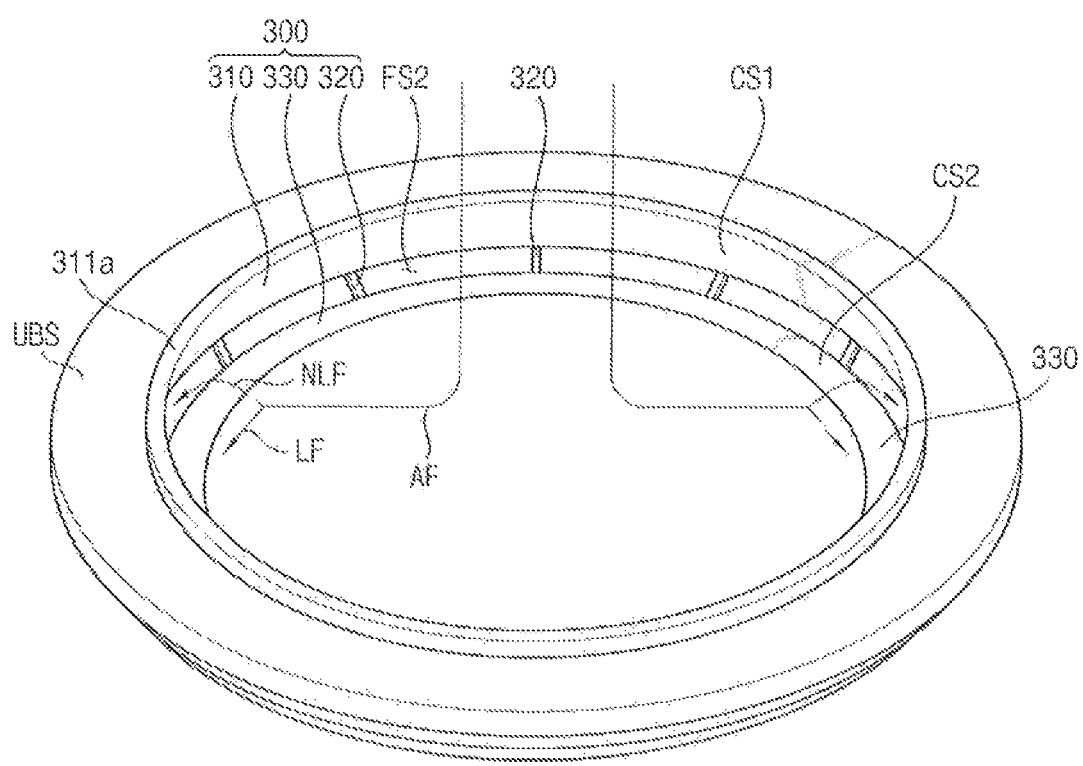
FIG. 4 is a perspective view illustrating a flow controller shown in FIG. 3.

FIG. 1 is a structural view illustrating a spin coater (e.g., a spin coating device) in accordance with an exemplary embodiment of the present inventive concept. FIG. 2 is an enlarged view of a portion A of the spin coater shown in FIG. 1. FIG. 3 is a perspective view illustrating the portion A of the spin coater shown in FIG. 2, and FIG. 4 is a perspective view illustrating a flow controller shown in FIG. 3.

Referring to FIGS. 1 to 4, a spin coater 500 in accordance with an exemplary embodiment of the present inventive concept includes a rotatable chuck structure 100 onto which a substrate W may be secured, a bowl 200 enclosing (e.g., surrounding) the substrate and guiding a flow around the substrate W to a bottom thereof and a flow controller 300 detachably coupled with the bowl 200 in such a configuration that the flow controller 300 is arranged between a sidewall of the bowl 200 and an edge E of the substrate W. The flow controller 300 may separate the flow into a linear flow LF and a non-linear flow NLF. The rotatable chuck structure 100 may include a platform to hold the substrate.

For example, the rotatable chuck structure 100 includes a rotatable chuck 110 (e.g., a platform) onto which the substrate W is secured and a support column 120 coupled to the rotatable chuck 110. An external power P may be applied to the rotatable chuck structure 100 to cause the rotatable chuck 110 to rotate in a particular direction. The rotatable chuck 110 may be connected to a shaft of a motor within the rotatable chuck structure 100 that receives the external power P. The substrate W may be secured to the rotatable chuck 110 by an electrostatic force or a mechanical force. The support column 120 may be rotated by the external power P and thus the chuck 110 may also be rotated by the support column 120. The thickness of a layer, which may be coated on the substrate W in the spin coater 500, may be varied according to the rotation speed of the chuck 110.

In an exemplary embodiment, the support column 120 is configured to vertically move upwards or downwards to enable the chuck 110 to move upwards or downwards in the spin coater 500. When the substrate W is loaded into the spin coater 500, the chuck 110 is moved upwards to a loading portion by the support column 120 and the substrate W may be positioned on the chuck 110 and secured to the chuck 110 by the electrostatic force or the mechanical force. When the substrate W is sufficiently secured to the chuck 110, the chuck 110 is moved downwards to a process position in the bowl 200 by the support column 120. Then, the spin coating process is performed onto the substrate W in the bowl 200.

For example, the bowl 200 may be shaped as an open cup in such a configuration that an upper portion of the bowl 200 is open and a discharge line 210 is connected to a lower portion of the bowl 200. The chuck 110 having the substrate W may be positioned at the lower portion of the bowl 200. Thus, the chuck 110 and the substrate W may be positioned at the processing portion in the bowl 200 so the substrate W is enclosed by a sidewall of the bowl 200.

A pressure member (not shown) may be provided under the bowl 200 to force air in the bowl 200 to flow downward from an upper portion of the bowl 200. Thus, the coating chemicals which are supplied onto the substrate W may flow to the discharge line 210 on the surface of the substrate W along a direction of the air flow AF in the bowl 200.

The air may be supplied into the bowl 200 at the upper portion thereof and may be forced to flow downwards in the bowl 200 by the pressure member, thereby forming a descending air flow in the bowl 200. When the coating chemicals are supplied onto the rotating substrate W under the descending air flow in the bowl 200, the coating chemicals may spread along a whole surface of the substrate W due to the rotation of the substrate W and may be guided to the discharge line 210 due to the descending air flow AF. Thus, the coating chemicals, which are supplied onto the rotating substrate W, may be discharged from the bowl 200 through the discharge line 210.

The coating chemicals may flow on the substrate W in the bowl 200 and the surface of the substrate W may be coated with the coating chemicals by the chemical flow, to thereby form a coating layer (not shown) on the substrate W. The coating chemicals may exit the substrate W through a flow space of the flow controller 300 between the sidewall of the bowl 200 and the edge E of the substrate W along the air flow AF in the bowl 200. That is, the chemical flow and the air flow may be directed downwards through the flow controller 300 in the bowl 200.

The descending air flow AF may be separated into the linear flow NF and the non-linear flow NLF by the flow controller 300. The linear flow NF may have a flow speed larger than that of the non-linear flow NLF. Since the coating chemicals flow on and exit from the substrate W together with the air flow AF, the flow speed of the chemical flow may increase when exiting the substrate W at the edge E, thereby preventing a thickness increase in the coating layer at the edge E of the substrate W. In addition, since the vertex of the chemical flow may be sufficiently prevented in the flow space around the edge E of the substrate W, the chemicals may be sufficiently prevented from flowing backwards onto the substrate W to thereby prevent particle defects on the coating layer on the substrate W.

For example, the flow controller 300 may be arranged in the flow space between the sidewall of the bowl 200 and the edge E of the substrate W, so that the shape of the flow space is modified by the flow controller 300. Thus, the flow characteristics of the air flow AF may be varied by modifying the flow space in the bowl 200, so that the flow characteristics of the air flow AF are controlled by the flow controller 300. Since the chemical flow of the chemicals may be discharged from the bowl 200 through the discharge line 210 along the air flow AF, the flow characteristics of the chemical flow may also be controlled by the flow controller 300. That is, the flow controller 300 may control the quality of the coating layer by changing the flow characteristics of the air flow AF.

In an exemplary embodiment of the inventive concept, the flow controller 300 includes a body 310 shaped into a ring (e.g., a first ring) and detachably coupled with an upper portion UB of the bowl 200, a control plate 330 shaped into a ring (e.g., a second ring) enclosing the substrate W and a plurality of connectors 320 connected with the body 310 and the control plate 330. In an exemplary embodiment, a first edge 330a of the control plate 330 is higher than an upper surface of the substrate W and a second edge 330b of the control plate 330 is lower than a lower surface of the substrate W. In an embodiment, the connectors 320 are arranged with a same interval between the body 310 and the control plate 330. The air flow AF may be separated into the linear flow NF and the non-linear flow BLF by the control plate 330.

The body 310 may function as a base structure for combining the control plate 330 with the upper portion UB (e.g., a first upper portion) of the bowl 200. Thus, the configurations and shapes of the body 310 may be varied according to the configurations and shape of the bowl 200.

For example, the body 310 includes an upper portion 311 (e.g., a second upper portion), a joint portion 312 and a flow guide 313. In an exemplary embodiment of the inventive concept, an upper surface BS of the body 310 is coplanar with an upper surface UBS of the bowl 200. In an exemplary embodiment, a protrusion 311a protrudes upwards from the upper surface BS of the upper portion 311. Thus, the protrusion 311a may be higher than the upper surface UBS of the bowl 200 and the upper surface BS of the body 310. A joint portion 312 may be provided under the upper surface BS and the body 310 may be coupled to the bowl 200 by the joint portion 312. In an exemplary embodiment of the inventive concept, the body 310 includes a flow guide 313 shaped into a curve extending between the protrusion 311a and the joint portion 312. For example, the flow guide 313 may be shaped into a convex curve with respect to the substrate W.

In an exemplary embodiment of the inventive concept, some of the upper surface UBS is recessed downwards and a receiver R (e.g., a receptacle) for receiving the joint portion 312 is provided with the bowl 200. For example, the joint portion 312 may be shaped into a stepped portion and the receiver R of the bowl 200 may be shaped into a counter stepped portion complementary to the stepped portion of the joint portion 312. Thus, the bowl 200 and the body 310 may be coupled to each other by the joint of the receiver R and the joint portion 312. For example, the receiver R and the joint portion 312 may be configured to mate with one another.

The coupling of the bowl 200 and the body 310 may be facilitated just by the manual joining of the complementary shapes of the receiver R and the joint portion 312 without any additional combination tools, thereby facilitating the combination of the bowl and the body 310.

The body 310 may be coupled to the bowl 200 by an interference fit along a radial direction of the bowl 200, so the body 310 is prevented from being separated from the bowl 200 by the vertex of the chemical flow when the vertex of the chemical flow flows upwards to the body 310 in the flow space between the substrate W and the bowl 200. The resistance of the vertex of the chemical flow may be weakened by the flow controller 300 and the vertex of the chemical flow may be guided to the discharge line 210.

In an exemplary embodiment of the inventive concept, the joint portion 312 is coupled to the bowl 200 in such a configuration that the upper surface UBS of the bowl 200 is coplanar with the upper surface BS of the body 310. Thus, the radius of the bowel 200 may be reduced by the body 310.

In an embodiment, the protrusion 311a is positioned at an inner end portion of the body 310 and extends along a circumferential line of the bowl 200 as a ring shape, so the upper surface UBS of the bowl 200 and the upper surface BS of the body 310 is separated from a space of the bowl 200 by the protrusion 311a.

In an exemplary embodiment, an outer surface of the protrusion 311a is configured into a vertical surface that is vertically extended from the upper surface BS of the body 310 and an inner surface of the protrusion 311a is shaped like a first curved surface CS1 of the flow guide 313. That is, the flow guide 313 may extend over the upper surface BS of the body 310 due to the protrusion 311a, so that the flow path of the vertex of the chemical flow extends over the upper surface BS of the body 310.

In an exemplary embodiment, a top portion of the flow guide 313 corresponding to an inner surface of the protrusion 311a extends over the upper surface BS of the body 310 in such a configuration that the orthogonal projection of the flow guide 313 overlaps with the upper surface BS of the body 310.

Therefore, when the vertex of the chemical flow flows along the flow guide 313 to a top portion of the protrusion 311a, the chemicals may overflow to the upper surface BS of the body 310 instead of returning to the substrate W. Thus, the minute particles of the vertex of the chemical flow may be prevented from being supplied onto the edge E of the substrate W, thereby preventing the contamination of the coating layer with the minute particles.

When the flow guide 313 is shaped into the convex curve with respect to the substrate W, the air flow AF and the chemical flow of the coating materials may pass toward the discharge line 210 along the first curve surface CS2 as a non-liner flow NLF.

When a lower portion of the flow guide 313 is curved proximal to the joint portion 312 and an upper surface of the control plate 330 facing the flow guide 313 is shaped into a concave curve with respect to the substrate W as described in detail hereinafter, the air flow AF and the chemical flow along the flow guide 313 may be diffused toward the inner surface of the bowl 200 around the discharge line 210. Accordingly, the vertex of the chemical flow may be sufficiently prevented around the second edge 330b of the control plate 330.

For example, the control plate 330 may be spaced apart from the edge E of the substrate W and may be shaped into a ring enclosing the substrate W. In an exemplary embodiment, an inner surface of the control plate 330, which faces the substrate W, has a flat surface and an outer surface of the control plate 330, which faces the body 310, has a curved surface. Particularly, the control plate 330 may be positioned in the flow space between the body 310 and the edge E of the substrate W, so that the flow characteristics of the air flow AF and the chemical flow passing through the flow space is varied by the control plate 330.

In an exemplary embodiment, the control plate 330 is slanted at a slanted angle θ with respect to the substrate W in such a configuration that the first edge 330a is higher than a surface of the substrate W and the second edge 330b is lower than the surface of the substrate W.

Thus, some of the air flow AF and the chemical flow may flow through a gap space between the inner surface of the control plate 330 and the edge E of the substrate W, and the rest of the air flow AF and the chemical flow may flow through a gap space between the outer surface of the control plate 330 and the first curve surface of the flow guide 313. Therefore, the flow space between the edge E of the substrate W and the flow guide 313 may be separated into a first flow space FS1 between the inner surface of the control plate 330 and the edge E of the substrate W and into a second flow space FS2 between the outer surface of the control plate 330 and the first curved surface of the flow guide 313. The outer surface, referred to as second curved surface CS2 hereinafter, of the control plate 330 and the first curved surface CS1 of the flow guide 313 may be spaced apart from each other by a length of the connector 320.

In an exemplary embodiment, the control plate 330 includes a body facing portion 331 shaped into a convex curve with respect to the flow guide 313 of the body 310 and having a second curved surface CS2 and a substrate facing portion 332. In an embodiment, the substrate facing portion 332 is integrally coupled with the body facing portion 331 in one body. In an embodiment, the substrate facing portion 332 is shaped into a flat plate. The body facing portion 331 may face the flow guide 313 of the body 310 and the substrate facing portion 332 may face the substrate W that is secured to the rotating chuck 110.

Thus, the first flow space FS1 is provided between the edge E of the substrate W and the substrate facing portion 332 and the second flow space FS2 is provided between the flow guide 313 and the body facing portion 331.

When the substrate facing portion 332 has a flat surface or a linear surface, the air flow AF and the chemical flow may uniformly flow along the flat surface of the substrate facing portion 332 in the first flow space FS1. Thus, the first flow space FS1 may be formed into a uniform space and the air flow AF and the chemical flow may be formed into a linear flow LF.

Since the control plate 330 is positioned in the flow space between the sidewall of the bowl 200 and the edge E of the substrate W, the gap space between the sidewall of the bowl 200 and the edge E of the substrate W may be reduced into a first gap space between the control plate 330 and the substrate W and a second gap space between the control plate 330 and the body 310. That is, when the chemical flow exits the substrate W together with the air flow AF, the chemical flow more rapidly exits the edge E of the substrate W because the size of the first flow space FS1 is smaller than that of the entire flow space. Thus, a speed reduction in the chemical flow may be sufficiently prevented around the edge E of the substrate W and sedimentation of the chemicals at the edge E of the substrate W, which is generally referred to as an edge bead defect, may be sufficiently prevented in the spin coater 500.

While the present specification discloses that the substrate facing portion 332 includes a linear surface, the substrate facing portion 332 may also include a curved surface as long as the gradient of the curved surface is sufficiently small for preventing the vertex of the chemical flow in the first flow space FS1. For example, the substrate facing portion 332 may be recessed into the control plate 330 to include a curved surface for enlarging the first flow space FS1.

In an embodiment, the body facing portion 331 is shaped into a convex curve with respect to the flow guide 313 and has a second curved surface CS2 facing the first curved surface CS1 of the flow guide 313, so that the convex-shaped flow guide 313 faces the convex-shaped body facing portion 331. Thus, the second flow space FS2 may have an hourglass shape of which the central portion is narrowed and both end portions are enlarged.

When the coating chemicals flow into the second flow space FS2, the chemical flow may be gradually accelerated toward the central portion from a first end portion proximal to the edge E of the substrate W of the second flow space FS2 and may be gradually decelerated toward a second end portion proximal to the discharge line 210 from the central portion of the second flow space FS2. In addition, the coating chemicals may flow toward the discharge line 210 on the first and the second curved surfaces CS1 and CS2 as the non-linear flow NLF.

That is, the coating chemicals may rapidly flow into the narrow central portion of the second flow space FS2 from the edge E of the substrate W and may slowly flow out toward the discharge line 210 in such a way that the chemical flow is diffused at the second end portion of the second flow space FS2. Accordingly, the chemical flow may be sufficiently prevented from colliding with the sidewall of the bowl 200 after exiting the edge E of the substrate W and thus the vertex of the chemical flow may be minimized in the spin coater 500.

Accordingly, the chemical flow of the coating materials exiting from the edge E of the substrate W together with the descending air flow AF may be separated into the linear flow LF passing through the first flow space FS1 and the non-linear flow NLF passing through the second flow space FS2. The linear flow LF of the chemical flow may exit the edge E of the substrate W at a relatively higher flow speed due to the size reduction of the first flow space FS1, so that the speed reduction of the chemical flow around the edge E of the substrate is sufficiently prevented and the flow loss of the chemical flow may be minimized. Thus, the sedimentation of the coating chemicals may be minimized at the edge E of the substrate W. In addition, the non-linear flow NLF of the chemical flow may pass along the first and the second curved surfaces CS1 and CS2 as a plurality of stream lines and may be diffused around the discharge line 210. Thus the vertex of the chemical flow may be sufficiently prevented at a bottom portion of the bowl 200. Therefore, the minute particles of the chemical flow may be prevented from returning onto the coating layer on the substrate W and the particle contamination to the coating layer may be sufficiently minimized due to the vertex reduction.

That is, since the flow speed and the vertex of the chemical flow are sufficiently prevented or minimized at the bottom portion of the bowl 200. The thickness uniformity of the coating layer may be improved along the whole surface of the substrate W due to the minimization of the edge bead defect at the edge E of the substrate W. Further, the particle contamination to the coating layer may be sufficiently prevented by the fluid controller 300.

Although the vertex of the chemical flow may partially occur along the first curved surface CS1 of the flow guide 313 due to the descending air flow AF in the second flow space FS2, the vertex of the chemical flow may pass along the first curve surfaced CS1 up to the inner surface of the protrusion 311a and may overflow onto the upper surface BS of the body 310 away from the center of the bowl 200. Thus, the minute particles of an unexpected vertex of the chemical flow may also be removed out of the bowl 200, thereby preventing the particle contamination to the coating layer caused by the unexpected vertex.

In an embodiment, the body 310 and the control plate 330 are connected to each other by the connector 320.

For example, the connector 320 may include a plurality of connecting rods that are arranged at the same intervals between the body 310 and the control plate 330 or a connecting net having a plurality of penetration holes. In an exemplary embodiment of the inventive concept, the connector 320 includes 4 to 8 connecting rods that are arranged at same intervals along a circumferential line of the ring shaped body 310 and the control plate 330.

In an exemplary embodiment, the connector 320 is positioned at a connection location at which the flow guide 313 and the body facing portion 331 of the control plate 330 are most proximal to each other. Thus, the non-linear flow NFL may have the highest flow speed around the connection location in the second flow space FS2.

The flow speed of the chemical flow may be varied by the relative position of the control plate 330 with respect to the substrate W and the configurations of the control plate 330 in the flow space.

The relative position of the control plate 330 with respect to the substrate W may be determined by a height h of the first edge 330a from the upper surface of the substrate W and a gap distance d between the first edge 330a and the edge E of the substrate W. In addition, the arrangement of the control plate 330 may be determined by a slanted angle θ of the substrate facing portion 332.

Accordingly, the fluid characteristics of the chemical flow may be changed by the height h and the gap distance d of the first edge 330a and the slanted angle θ of the substrate facing portion 332. To determine the optimal position of the control plate 330, a flow speed experiment was conducted with respect to 9 plate pieces, which had different heights h, gap distances d and slanted angles θ as shown in the following configuration table. Each of the plate pieces in the configuration table was positioned in the flow space of the spin coater 500 and the flow speed of the air flow AF was measured at the edge E of the substrate W by each plate piece.

Configuration table of the control plate

| Number of plate piece | gap distance (mm) | height (mm) | slanted angle (θ) |
|---|---|---|---|
| 1 | 3.0 | 1.0 | 50.0 |
| 2 | 4.0 | 1.0 | 50.0 |
| 3 | 3.0 | 3.0 | 50.0 |
| 4 | 4.0 | 3.0 | 50.0 |
| 5 | 3.0 | 1.0 | 55.0 |
| 6 | 4.0 | 1.0 | 55.0 |
| 7 | 3.0 | 3.0 | 55.0 |
| 8 | 4.0 | 3.0 | 55.0 |
| 9 | 3.5 | 2.0 | 52.5 |

Figure 5:
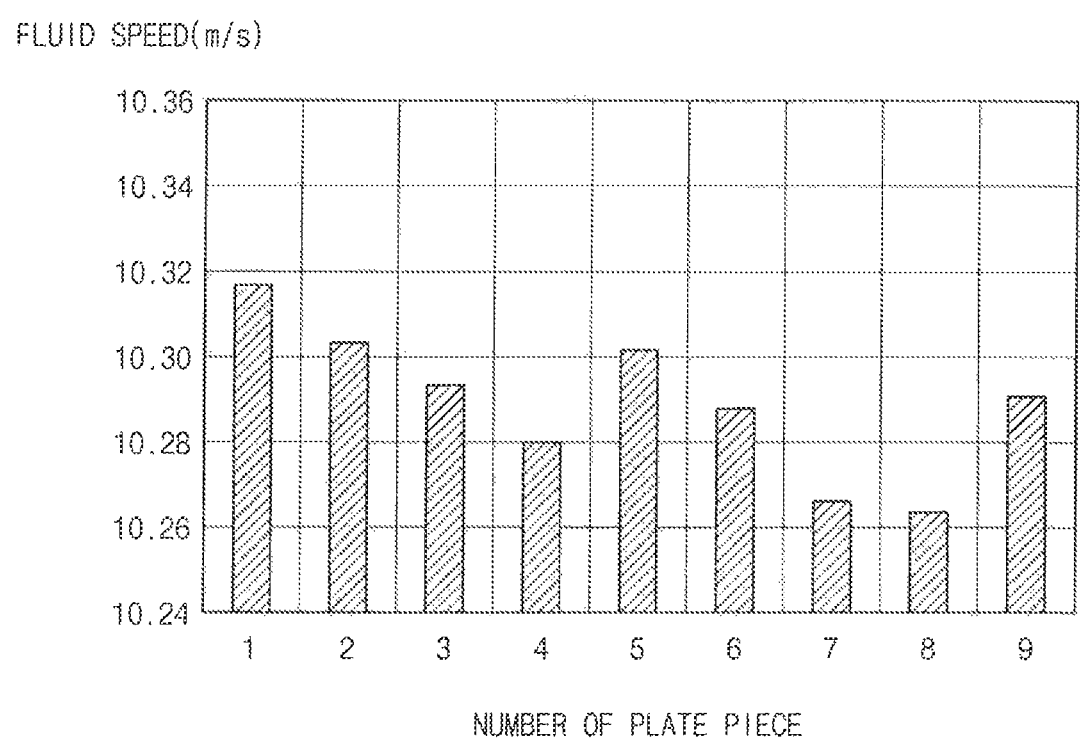
FIG. 5 is a graph showing the flow speed of the air flow at the edge of the substrate with respect to each plate piece of the configuration table.

FIG. 5 is a graph showing the flow speed of the air flow at the edge of the substrate with respect to each plate piece of the configuration table.

As shown in FIG. 5, the flow speed of the air flow is more decisively determined by the height h rather than the gap distance d and the slanted angle θ. Thus, the height h at which the flow speed of the air flow was measured to be highest is firstly selected as the optimal height of the control plate 330, and then the gap distance d and the slanted angle θ at which the flow speed of the air flow was measured to be highest may be secondly determined as the optimal gap distance and the optimal slanted angle of the control plate 330 on condition that the height of the control plate 330 is selected as the optimal height.

In an exemplary embodiment, the control plate 330 has the height h in a range of about 1 mm to about 2 mm and the gap distance d in a range of about 3 mm to about 4 mm while the control plate 330 is slanted with respect to the substrate W at the slanted angle θ in a range of about 50° to about 55°.

According to an exemplary embodiment of the spin coater 500, the flow controller 300 is arranged between the edge E of the substrate W and the bowl 200. Thus, the chemical flow of the coating chemicals are separated into the linear flow LF having a relatively high flow speed around the edge E of the substrate W and the non-linear flow NLF having a relatively small flow speed at the bottom portion of the bowl 200. Thus, since speed reduction of the chemical flow may be prevented at the edge E of the substrate W in the first flow space FS1. Further, the edge bead defect may be sufficiently prevented at the edge E of the substrate W. In addition, the non-linear flow NLF passing through the second flow space FS2 as a plurality of stream lines may be diffused around the discharge line 210, so that the vertex of the chemical flow may be sufficiently prevented at the bottom portion of the bowl 200. Thus, the minute particles of the chemical flow may be prevented from returning onto the coating layer on the substrate W, and the particle contamination to the coating layer may be minimized due to the vertex reduction.

In addition, the flow controller 300 may be detachably coupled with the bowl 200 just by the manual joining of the body 310 to the upper portion of the bowl 200 without any additional combination tools, thereby facilitating the combination of the bowl 200 and the flow controller 300.

Figure 6:
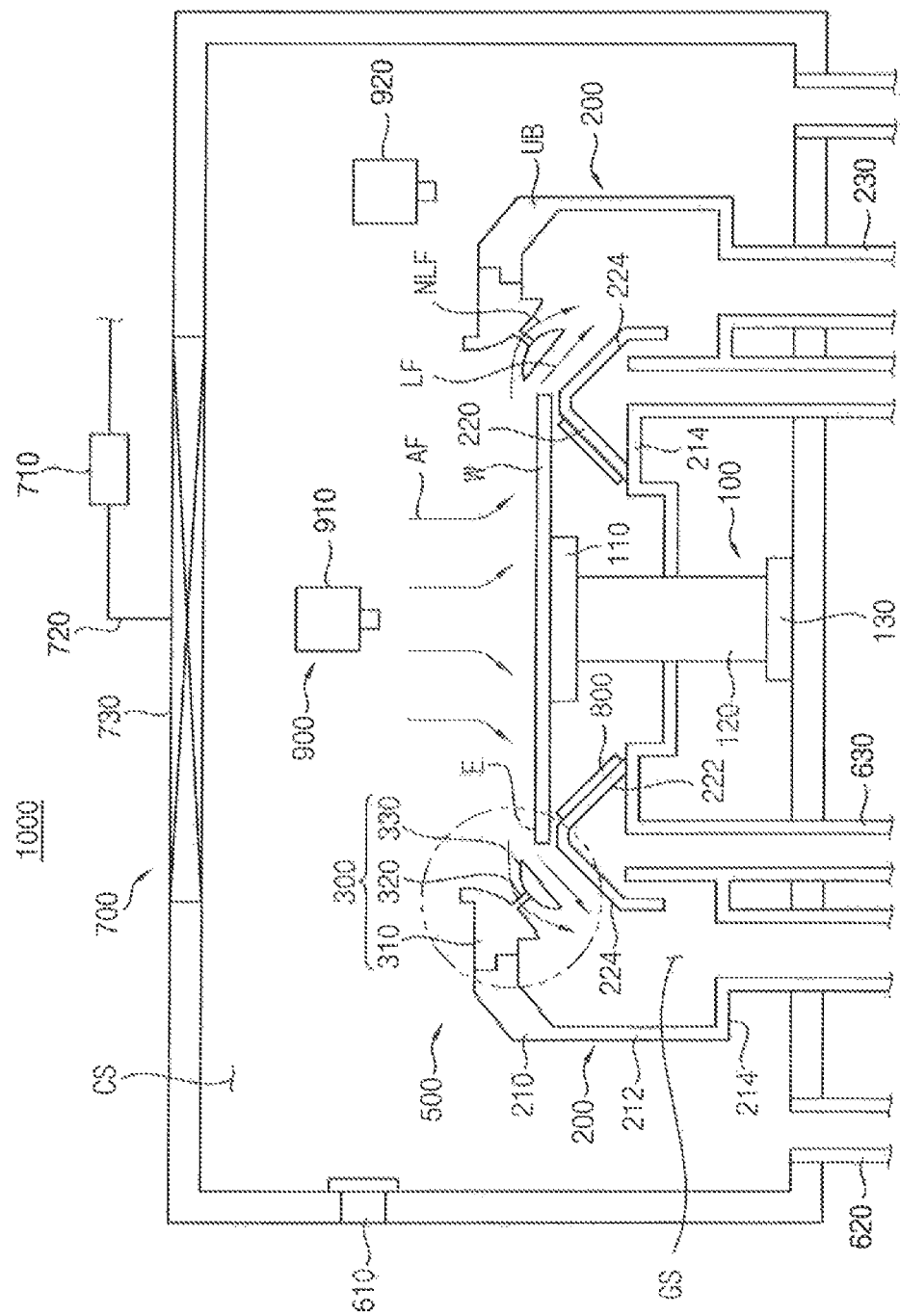
FIG. 6 is a structural view illustrating a substrate treating apparatus having the spin coater shown in FIG. 1 in accordance with an exemplary embodiment of the present inventive concept.

FIG. 6 is a structural view illustrating a substrate treating apparatus having the spin coater shown in FIG. 1 in accordance with an exemplary embodiment of the present inventive concept.

Referring to FIG. 6, a substrate treating apparatus 1000 in accordance with an exemplary embodiment of the present inventive concept includes a spin coater 500, a housing 600, a flow generator 700, a bevel cleaner 800 and a chemical supplier 900.

In an exemplary embodiment of the inventive concept, the substrate treating apparatus 1000 includes an apparatus for forming a photoresist layer on a substrate by a coating process using a photoresist solution as the chemicals. However, other chemicals as well as the photoresist solution may be used in the substrate treating apparatus as long as the chemicals are supplied onto a rotating substrate.

For example, the housing 600 may be shaped into a cylinder or a rectangular pipe having a sufficient inner space therein. A gate 610 may be provided at a side of the housing 600. The substrate W to which the spin coating process is to be applied may be loaded into the housing 600 and the substrate W to which the spin coating process has completed may be unloaded from the housing 600 through the gate 610. A gate door (not shown) may be installed in the gate 610.

When the substrate W is loaded into the housing 600, the gate door may be closed so that the inner space of the housing 600 is isolated from the surroundings. That is, the inner space of the housing 600 may be formed into a closed space CS.

In an embodiment, an outer exhaust hole 620 and an inner exhaust hole 630 are arranged at a bottom of the housing 600. The descending flow in the closed space CS of the housing 600 may be exhausted to the surroundings through the outer and inner exhaust holes 620 and 630. An exterior exhaustion device such as a pump may be connected to the exhaust holes 620 and 630, so that the descending flow is generated in the closed space CS by the exterior exhaustion device. The pump may remove fluid through the exhaust holes 620 and 630 using suction.

The flow generator 700 may be arranged at a ceiling of the housing 600 and supply clean air into the closed space CS of the housing 600. The flow generator may inject clean air into the closed space CS and clean air may flow downwards to the bottom of the housing 600. The clean air may be forced to flow downwards to the exhaust holes 620 and 630 by the exterior exhaustion device, so that the clean air is formed into the descending flow from the ceiling to the bottom of the housing 600.

For example, the flow generator 700 may include an air filter 710, an air line 720 and an air fan 730. The air may be supplied to the housing 600 from an exterior air source (not shown) via the air line 720. The air filter 710 may be installed in the air line 720. Thus, contaminants or impurities in the air may be filtered out by the air filter 710 to generate clean air and then the clean air may be supplied into the housing 600. In an exemplary embodiment, the clean air has a sufficient clean class for the standard requirements of manufacturing semiconductor devices.

The clean air may be forced into the housing 600 by the air fan 730. For example, the air fan 730 may be arranged at a central portion of the ceiling of the housing 600, and the clean air may be forcibly injected downwards into the closed space CS of the housing 600. Accordingly, the clean air may flow downwards from the ceiling of the housing 600 as the descending air flow AF.

The spin coater 500 for forming the photoresist layer on the substrate W may be arranged at the bottom of the housing 600. The spin coater 500 may be arranged to face the flow generator 700 in the housing 600. The spin coater 500 may have substantially the same structures and configurations as the spin coater shown in FIG. 1. In FIG. 6, the same reference numerals denote the same elements in FIG. 1.

For example, the spin coater 500 may include the rotatable chuck structure 100 onto which a substrate W is secured, the bowl 200 enclosing the substrate W and guiding the air flow AF downwards to a bottom of the bowl 200 and the flow controller 300 detachably coupled with the bowl 200 in such a configuration that the flow controller 300 is arranged between the sidewall of the bowl 200 and the edge E of the substrate W and the air flow AF is separated into the linear flow LF and the non-linear flow NLF by the flow controller 300.

The rotatable chuck structure 100 may be secured to the bottom of the housing 600. The substrate W may be secured onto the rotatable chuck structure 100 and may be rotated according to the rotation of the rotatable chuck structure 100.

For example, the rotatable chuck structure 100 may include the rotatable chuck 110 onto which the substrate W is secured and rotating at a predetermined rotation speed, a support column 120 coupled with the rotatable chuck 110 and transferring a driving power to the rotatable chuck 110 and an external power source 130 for generating the driving power.

The rotatable chuck 110 may include a disk (e.g., acting as a platform) having a radius smaller than that of the substrate W and the substrate W may be secured to the rotatable chuck 110. The rotatable chuck 110 may include an electrostatic chuck onto which the substrate W is secured by an electrostatic force or a vacuum chuck onto which the substrate W is secured by a vacuum force.

The support column 120 may extend downwards from the rotatable chuck 110 and may be connected to the external power source 130. Thus, the driving power generated from the power source 130 may be transferred to the chuck 110 via the support column 120. For example, the support column 120 may vertically move upwards or downwards and may be rotated with respect to an axis thereof, so that the chuck 110 is lifted or lowered according to the vertical movement of the support column 120 and is rotated according to the rotation of the support column 120. In an exemplary embodiment, the power source includes an electric motor.

For example, the bowl 200 may be shaped as an open cup and a receiving space may be provided in the bowl 200. The bowl 200 may be installed on the bottom of the housing 600 and the rotatable chuck structure 100 may be received in the receiving space of the bowl 200. Therefore, the substrate W secured to the rotatable chuck 110 may be enclosed by sidewall of the bowl 200.

For example, the bowl 200 may include an outer bowl 210 and an inner bowl 220. The outer bowl 210 may include an outer sidewall 212 and a bottom wall 214 and may enclose the rotatable chuck structure 100. The inner bowl 220 may be positioned under the substrate W and may include a slanted wall 222. In an embodiment, the slanted wall 222 is slanted upwardly toward the edge E of the substrate W.

The outer sidewall 212 may be shaped into a ring enclosing the chuck structure 100 and the bottom wall 214 may be shaped into a disk connected to the ring-shaped outer sidewall 212. The bottom wall 214 may extend from a lower portion of the outer sidewall 212 toward a central portion of the bowl 200, so that the receiving space of the bowl 200 is defined by the bottom wall 214.

A chemical discharge line 230 and the inner exhaust hole 630 may be provided at the bottom wall 214. The chemicals of the coating materials may be discharged through the chemical discharge line 230 and may be collected by a recycling system (not shown). The descending air flow AF may flow into the outer bowl 210 from the upper portion of the bowl 200 and may be discharged to the surroundings via the inner exhaust hole 630.

The inner bowl 220 may be interposed between the outer sidewall 212 and the chuck structure 100 and may be shaped into a ring enclosing the support column 120 and the rotatable chuck 110. Thus, the inner bowl 220 may have the same central axis as the outer bowl 210 and may have a radius smaller than that of the outer bowl 210. The slanted wall 222 may be positioned on the bottom wall 214 under the substrate W as a slanted slender member slanted upwardly toward the edge E of the substrate W from the bottom wall 214. Therefore, the bottom wall 214 and the slanted wall 222 may constitute the inner bowl 220. In an embodiment, the inner bowl 220 is shaped into a truncated reverse cone.

A guide member 224 is connected to a top portion of the slanted wall 222. In an embodiment, the guide member 224 is slanted downwardly toward the chemical discharge line 230. For example, the guide member 224 may be shaped into a slanted disk along the circumferential line of the inner bowl 220. Thus, the air flow and the chemical flow passing through the flow space between the edge E of the substrate W and the flow controller 300 may be guided to the outer bowl 210 by the guide member 224.

The inner exhaust hole 630 may be covered by the combination of the slanted wall 222 and the guide member 224. Thus, the chemicals of the coating materials may be prevented from discharging through the inner exhaust hole 630.

In an embodiment, the bevel cleaner 800 is arranged on the slanted wall 222 under the substrate W to inject a cleaning solution to the edge E of the substrate W. The cleaning solution may be used to remove the edge bead from the substrate W. That is, when the photoresist coating process applied to the substrate W has completed, the cleaning solution may be injected to the edge E of the substrate W, thereby performing an edge bead removal (EBR) process.

The bevel cleaner 800 may include at least one cleaning nozzle. That at least one cleaning nozzle may be positioned on the slanted wall 222 toward the edge E of the substrate W. For example, a pair of the cleansing nozzles may be arranged on the slanted wall 222 symmetrically with respect to a central axis of the inner bowl 220.

A cleaning line may be connected to the cleaning nozzle through the bottom wall 214 adjacent to the support column 120 and the cleaning solution may be supplied to the cleaning nozzle via the cleaning line. The edge bead may be dissolved into the cleaning solution and removed from the edge E of the substrate W. For example, the cleaning solution may include an organic solvent for dissolving semi-consolidated photoresist materials. The cleaning solution including the dissolved edge bead may be guided to the outer bowl 210 and may be discharged from the spin coater 500 through the chemical discharge line 230.

The receiving space between the outer bowl 210 and the inner bowl 220 may be provided as a gathering space GS of the chemicals and the cleaning solution including the dissolved edge bead.

When the photoresist materials are applied to the substrate W, the photoresist materials may spread out on a whole surface of the substrate W due to the rotation of the substrate W. The photoresist fluid may exit the substrate W at the edge E through the flow space between the upper portion UB of the bowl 200 and the edge E of the substrate W along the descending air flow AF. The photoresist fluid in the gathering space GS may be discharged from the spin coater 500 through the chemical discharge line 230 and may be collected by a chemical recovery system (not shown). In addition, the air in the gather space GS may be discharged to the surroundings from the spin coater 500 through the inner exhaust hole 630.

The flow controller 300 may be positioned in the flow space FS between the upper portion UB of the bowl 200 and the edge E of the substrate W. The photoresist fluid and the air flow AF may be separated into the linear flow FL having a relatively higher flow speed and the non-linear flow NFL having a relatively lower flow speed by the fluid controller 300.

In an exemplary embodiment, the flow controller 300 includes a body 310 shaped into a ring that is detachably coupled with the upper portion UB of the bowl 200, the control plate 330 interposed between the body 310 and the substrate W and separating the flow space into a first flow space FS1 around the substrate W and a second flow space FS2 around the body 310 and the connector 320 connecting the control plate 330 to the body 310. The linear flow LF passes through the first flow space FS1 and the non-linear flow NLF passes through the second flow space FS2.

The flow controller 300 may have substantially the same structure as the fluid controller shown in FIG. 1, so any further detailed descriptions on the flow controller 300 will be omitted hereinafter.

The substrate facing portion 332 of the control plate 330 may have a flat surface in parallel with the guide member 224, and thus air and chemicals may uniformly flow through the first flow space FS1 as the linear flow.

Since the size of the first flow space FS1 is smaller than the entire flow space FS, the photoresist materials flow more rapidly exit the edge E of the substrate W. Thus, speed reduction of the chemical flow may be sufficiently prevented around the edge E of the substrate W and the sedimentation of the chemicals at the edge E may be prevented in the spin coater 500. In addition, the non-linear flow NLF of the chemical flow may pass along the first and the second curved surfaces CS1 and CS2 as a plurality of stream lines and may be diffused around the discharge line 210. Thus, the vertex of the chemical flow may be sufficiently prevented at a bottom portion of the bowl 200. Therefore, the minute particles of the chemical flow may be prevented from returning onto the coating layer on the substrate W and the particle contamination to the coating layer may be sufficiently minimized due to the vertex reduction.

In an embodiment, the chemical supplier 900 is arranged over the spin coater 500 so the photoresist materials can be applied to the substrate from the chemical supplier 900. For example, the chemical supplier 900 may include a first nozzle 910 for injecting a photoresist solution and a second nozzle 920 for injecting a dilution solution. The photoresist solution may be supplied to the first nozzle 910 from an exterior chemical reservoir and the dilution solution may also be supplied to the second nozzle 920 from another exterior chemical reservoir.

The coating process for forming the photoresist layer on the substrate W may be performed through a first step of coating the photoresist materials and a second step of removing edge beads from the edge E of the substrate W.

In an embodiment, the photoresist solution is injected onto the central portion of the substrate W from the first nozzle 910, and is spread on the whole surface of the substrate W by the rotation of the substrate W. When the photoresist solution is sufficiently applied to the substrate W, the first nozzle 910 stops providing the photoresist solution. The first nozzle 910 may be moved to a standby area. Thereafter, the second nozzle 920 is positioned over the central portion of the substrate W. The second nozzle 920 then injects the dilution solution onto the substrate W for diluting the photoresist materials. Therefore, the photoresist layer may be formed on the substrate W.

Thus, the flow speed of the photoresist flow around the edge E of the substrate W can be maintained at a sufficiently high level and the vertex of the photoresist flow may be sufficiently prevented around the bottom of the bowl 200 by the flow controller 300. Thus, the sedimentation of the photoresist materials at the edge E may be minimized and the minute particles of the photoresist flow may be prevented from returning onto the coating layer on the substrate W, thereby minimizing the particle contamination to the coating layer due to the vertex reduction.

Thereafter, the edge bead removal (EBR) process may be applied to the substrate W. When the photoresist solution exits the rotating substrate W, the flow speed of the photoresist flow may become slow at the edge E as compared with the central portion of the substrate W. Thus, the photoresist materials may be deposited on the edge E of the substrate W, so the photoresist layer is formed to be thicker at the edge than other portion of the substrate W just like beads. When initiating the EBR process, the second nozzle 920 may move to the standby area and the cleaning solution may be injected onto the edge beads from the bevel cleaner 800 arranged on the slanted wall 222. The edge beads may be removed from the edge E of the substrate W, thereby forming the photoresist layer on the substrate W. Since the formation of the edge beads may be minimized by the flow controller 300, the process efficiency of the EBR process may be sufficiently improved by the flow controller 300.

Figure 7:
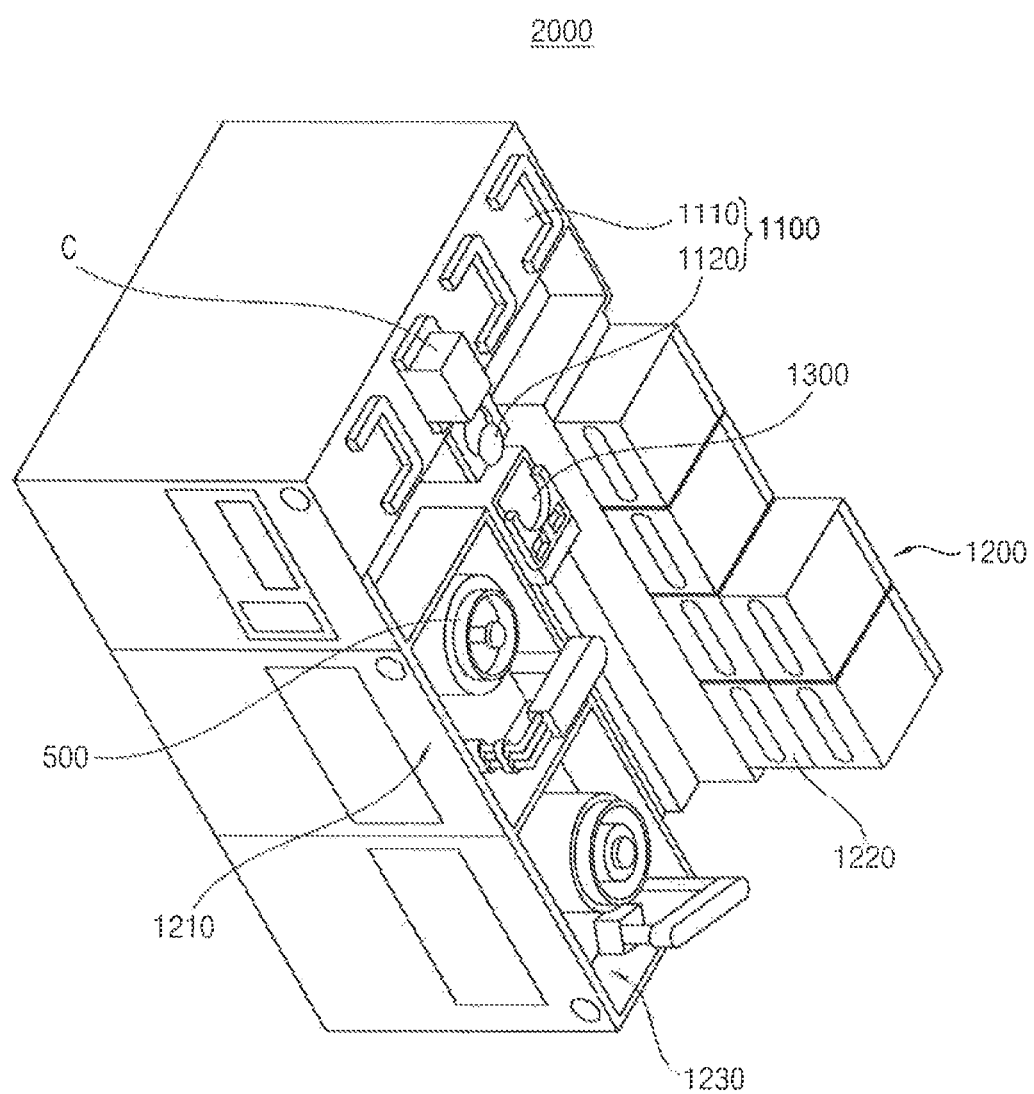
FIG. 7 is a perspective view illustrating a substrate treating system having the substrate treating apparatus shown in FIG. 6 in accordance with an exemplary embodiment of the present inventive concept.

FIG. 7 is a perspective view illustrating a substrate treating system having the substrate treating apparatus shown in FIG. 6 in accordance with an exemplary embodiment of the present inventive concept. A photo spinner system may be exemplarily disclosed as the substrate treating system in FIG. 7. However, the present inventive concept may be applied to any other substrate treating systems as well as the photo spinner system as long as the system includes the spin coater shown in FIG. 1 or the substrate treating apparatus shown in FIG. 6. In FIG. 7, the same reference numerals denote the same elements of the spin coater 500 in FIG. 1 and the same elements of the substrate treating apparatus 1000 in FIG. 6.

Referring to FIG. 7, a substrate treating system 2000 in accordance with an exemplary embodiment of the present inventive concept includes a carrier unit 1100 receiving a carrier C in which a plurality of substrates are held, a substrate treating apparatus 1200 having a spin coater 500 for forming a photoresist layer on the substrate in an in-line process and a transfer unit 1300 transferring the substrate between the carrier and the substrate treating apparatus 1200.

The carrier unit 1100 includes a carrier port 1110 having a plurality of the carriers C and an index 1120 individually drawing out the substrate W from each carrier C and individually stacking a substrate W into each carrier C.

A plurality of the substrates W, which are to be processed in the photo spinning system, may be stacked in the carrier C. The carrier C may be transferred to the carrier port 1110 by an automatic transfer system such as an over head transfer (OHT) system. In addition, a plurality of the processed substrates W to which the photoresist coating process has been applied may also be stacked in the carrier C. The carrier C may be transferred to another process system from the carrier port 1110 by the automatic transfer system.

For example, the carrier port 1110 may include a plurality of receiving sites. The receiving sites may be separated by guide bars and a carrier C may be located at the receiving site. Thus, the receiving sites may be sufficiently spaced apart from each other in such a configuration that the neighboring carriers do not interfere with each other. In the present exemplary embodiment, four receiving sites are provided with the carrier port 1110 and four carriers are simultaneously located in the carrier port 1110. The carrier C may include about 25 substrates W such as silicon wafers. Thus, the carrier port 1110 may receive about 100 substrates W at a time. That is, the handling capacity of the photo spinning system 2000 may be about 100 substrates W.

The index 1120 may individually detect the carrier C in each receiving site and individually draw out a single substrate W from the carrier C. Then, the substrate W may be transferred to the transfer unit 1300 by the index 1120. In addition, the processed substrate W may be unloaded from the substrate treating apparatus 1200 by the transfer unit 1300, and then the transfer unit 1300 may transfer the processed substrate W to the index 1120. Then, the index 1120 may stack the processed substrate W into each carrier C in the carrier port 1110. In an exemplary embodiment, the index 1120 includes an index arm that moves between the carrier port 1110 and the transfer unit 1300.

The transfer unit 1300 may transfer the substrate W between the carrier unit 1100 and the substrate treating apparatus 1200 and between process units of the substrate treating apparatus 1200. For example, the transfer unit 1300 may include a transfer rail (not shown) extending to each process unit of the substrate treating substrate 1200 and a robot arm (not shown) moving along the transfer rail and loading/unloading the substrate W to or from the process unit.

The substrate treating apparatus 1200 may include a plurality of unit process chambers that are sequentially arranged in the transfer rail. The unit process chambers may perform unit processes for a photolithography process. Thus, the formation of the photoresist layer, the photo process applied to the photoresist layer and a lithography process applied to the photoresist layer may be sequentially performed in a corresponding unit process chamber. That is, the photolithography process may be automatically and sequentially performed in the substrate treating system 2000 as a single in-line process. The substrate transfer between the unit process chambers may be performed by the transfer unit 1300.

For example, the substrate treating apparatus 1200 may include a spin coater 1210 forming the photoresist layer on the substrate W by a spin coating process, a baker 1220 hardening the photoresist layer and an exposer 1230 exposing the hardened photoresist layer to a light. The baker 1220 may apply heat to harden the photoresist layer. Although not shown, a developer (not shown) may be further provided with the substrate treating apparatus 1200. The developer may be arranged adjacent to the exposer 1230 and may develop the exposed photoresist layer to thereby form a photoresist pattern on the substrate W.

When the substrate W is loaded into the spin coater 1210, the spin coating process may be applied to the substrate W by using the photoresist solution and thus the photoresist layer may be formed on the substrate W. The substrate W may be repeatedly interchanged between the spin coater 1210 and the baker 1220, so that a thermal treatment is applied to the substrate W each time a thermal treatment is required in the coating process. The substrate W coated by the photoresist layer may be transferred to the exposer 1230 by the transfer unit 1300 and the exposure process may be applied to the photoresist layer by using a reticle. Then, the substrate W having the exposed photoresist layer may be transferred to the developer by the transfer unit 1300. The photoresist layer may be formed into the photoresist pattern in the developer as a transcript pattern of the reticle.

The spin coater 1210 may have substantially the same structures as the spin coater 500 shown in FIG. 1. Thus, the spin coater 1210 may include the flow controller 300 interposed between the sidewall of the bowl 200 and the substrate W on the rotating chuck 110. The photoresist flow flowing to the bottom of the bowl 200 together with the air flow AF may be separated into the linear flow LF having a relatively higher flow speed and the non-linear flow NLF having a relatively lower flow speed by the flow controller 300.

The flow controller 300 may include the body 310 shaped into a ring and detachably coupled with an upper portion UB of the bowl 200, the control plate 330 shaped into a ring enclosing the substrate W in such a configuration that the first edge 330a is higher than an upper surface of the substrate W and the second edge 330b is lower than a lower surface of the substrate W and the connector 320 connected with the body 310 and the control plate 330.

In an exemplary embodiment, the upper surface BS of the body 310 is coplanar with the upper surface UBS of the bowl 200 and the protrusion 311a protrudes upwards from the upper surface 311. Thus, the protrusion 311a may be higher than the upper surface UBS of the bowl 200 and the upper surface BS of the body 310. The joint portion 312 may be provided under the upper surface BS and the body 310 may be coupled to the bowl 200 by the joint portion 312. In an embodiment, the body 310 includes the flow guide 313 that may be shaped into a curve extending between the protrusion 311a and the joint portion 312. For example, the flow guide 313 may be shaped into a convex curve with respect to the substrate W. The control plate 330 may include a body facing portion 331 having a second curve surface CS2 proximate to the body 310 and a substrate facing portion 332 having a flat surface proximate to the substrate W. The connector 320 may include a plurality of connecting rods that are arranged at same intervals between the body 310 and the control plate 330.

Thus, even though the flow speed of the photoresist flow is not sufficiently reduced around the edge E of the substrate W, the vertex of the photoresist flow may be sufficiently prevented around the bottom of the bowl 200 by the flow controller 300. Thus, the sedimentation of the photoresist materials at the edge E may be minimized and the minute particles of the photoresist flow may be prevented from returning onto the coating layer on the substrate W. Since the sedimentation and vertex can be reduced, the particle contamination to the coating layer due can also be reduced.

According to an exemplary embodiment, the flow controller is arranged in the flow space between the sidewall of the bowl and the edge of the substrate in such a configuration that the chemical flow is separated into the linear flow having a relatively higher speed and the non-linear flow having a relatively lower flow speed. Thus, the flow loss of the chemical flow may be sufficiently prevented at the edge of the substrate to thereby sufficiently prevent the sedimentation of the chemicals and the edge beads at the edge of the substrate. In addition, the vertex of the chemical flow may be sufficiently prevented around the bottom of the bowl by the flow controller 300, so that the minute particles of the photoresist flow may be prevented from returning onto the coating layer on the substrate W, thereby minimizing the particle contamination to the coating layer due to the vertex reduction.

The flow controller may be detachably coupled with the bowl just by the manual joining of the body to the upper portion of the bowl without any additional combination tools, thereby facilitating the combination of the bowl and the flow controller. The flow controller and the bowl may be simultaneously manufactured in a single injection molding process, thereby facilitating the manufacture of the flow controller as well as the combination of the flow controller to the bowl.

Although a few exemplary embodiments of the inventive concept have been described above, those skilled in the art will readily appreciate that many modifications are possible in the exemplary embodiments without materially departing from the present invention. Accordingly, all such modifications are intended to be included within the scope of the present invention.

What is claimed is:

1. A spin coater comprising:
a rotatable chuck structure configured to hold a substrate;
a bowl enclosing the rotatable chuck structure, the bowl including a discharge line connected to a lower portion of the bowl, the bowl configured to guide a chemical flow of coating materials around the substrate to the discharge line at the lower portion of the bowl; and
a flow controller detachably coupled to the bowl, wherein the flow controller is arranged between the bowl and an edge of the substrate and separates the chemical flow discharged from the bowl,
wherein the flow controller comprises:
a body shaped into a ring including an upper portion, a joint portion coupled to the bowl below the upper portion, and a flow guide having a convex curve with respect to the substrate and having a first curved surface that curvilinearly extends between the upper portion and the joint portion, the upper portion having an upper surface coplanar with an upper surface of the bowl and a protrusion that protrudes upwards from the upper surface of the upper portion at an inner side of the body;
a control plate shaped into a ring enclosing the substrate at a slanted angle with respect to the substrate such that a first edge of the control plate is higher than an upper surface of the substrate and a second edge of the control plate opposite to the first edge is lower than the upper surface of the substrate; and
a connector connecting the control plate to the body.

2. The spin coater of claim 1, wherein a top portion of the flow guide corresponding to an inner surface of the protrusion extends over the upper surface of the upper portion such that an orthogonal projection of the flow guide overlaps with the upper surface of the upper portion.

3. The spin coater of claim 1, wherein the control plate comprises:
a first facing portion having a convex curve including a second curve surface that faces the flow guide of the body; and
a second facing portion integrally coupled with the first facing portion and shaped into a flat plate that faces the substrate and opposes the second curve surface.

4. The spin coater of claim 3, wherein a first flow space is located between the first facing portion of the control plate and the flow guide of the body that enables the chemical flow to flow between the control plate and the flow guide and to diffuse at a bottom of the bowl such that a flow speed of the chemical flow decreases from a central portion to an end portion of the first flow space.

5. The spin coater of claim 3, wherein a second flow space is located between the flat plate and the substrate that enables a flow loss of the chemical flow at an edge of the substrate to be minimized.

6. The spin coater of claim 1, wherein the connector includes a plurality of connecting rods arranged at a same interval between the body and the control plate.

7. The spin coater of claim 6, wherein a space is present between each of the connecting rods.

8. The spin coater of claim 1, wherein the connector includes a rod slanted with respect to a rotatable column of the rotatable chuck structure holding the substrate.

9. A spin coater comprising:
a rotatable chuck structure configured to hold a substrate;
a bowl enclosing the rotatable chuck structure;
a first ring detachably coupled to a first upper portion of the bowl positioned higher than the substrate, the first ring comprising a second upper portion having an upper surface coplanar with an upper surface of the bowl and a protrusion that protrudes upwards from the upper surface of the second upper portion at an inner side of the first ring, a joint portion provided under the upper surface of the second upper portion and coupled to the bowl, and a flow guide having a convex curve with respect to the substrate and having a first curve surface that curvilinearly extends between the protrusion of the second upper portion and the joint portion;

a second ring distinct and separate from the bowl and enclosing the the substrate at a slanted angle with respect to the substrate such that a first edge of the second ring is higher than an upper surface of the substrate and a second edge of the second ring opposite to the first edge is lower than the upper surface of the substrate; and a connector connecting the second ring to the first ring, wherein the connector is slanted to enable an inner side of the second ring to face the substrate at a slanted angle.

10. The spin coater of claim 9, wherein the rotatable chuck structure comprises a platform for holding the substrate, and the second ring is a sufficient distance away from the platform to ensure there is space between the substrate and the second ring.

11. The spin coater of claim 9, wherein a first edge of the inner side is higher than an upper surface of the substrate and a second edge of the inner side opposite to the first edge is lower than the upper surface of the substrate.

12. The spin coater of claim 9, wherein the connector includes a plurality of connecting rods arranged at a same interval between the first ring and the second ring.

13. The spin coater of claim 12, wherein a space is present between each of the connecting rods.

14. The spin coater of claim 9, wherein an outer surface of the first ring has a stepped portion and an inner surface of the upper portion has a counter stepped portion that mates with the stepped portion.

15. The spin coater of claim 9, wherein the connector includes a rod slanted with respect to a rotatable column of the rotatable chuck structure holding the substrate.

16. The spin coater of claim 1, wherein an outer surface of the flow controller has a stepped portion and an inner surface of the first upper portion of the bowl has a counter stepped portion that mates with the stepped portion.

* * * * *